United States Patent
Sherlekar et al.

[11] Patent Number: 5,943,243
[45] Date of Patent: Aug. 24, 1999

[54] METHOD AND SYSTEM FOR REMOVING HARDWARE DESIGN OVERLAP

[75] Inventors: Deepak D. Sherlekar, Wappingers Falls; Craig R. Selinger, Spring Valley, both of N.Y.

[73] Assignee: International Business Machines Corporation, Armonk, N.Y.

[21] Appl. No.: 08/739,142

[22] Filed: Oct. 28, 1996

[51] Int. Cl.[6] .................................................. G06F 17/50
[52] U.S. Cl. ............................................................ 364/491
[58] Field of Search ..................................... 364/488–491

[56] References Cited

U.S. PATENT DOCUMENTS

| | | | |
|---|---|---|---|
| 4,630,219 | 12/1986 | DiGiacomo et al. | 364/488 |
| 5,303,161 | 4/1994 | Burns et al. | 364/490 |
| 5,309,371 | 5/1994 | Shikata et al. | 364/491 |
| 5,398,195 | 3/1995 | Kim | 364/491 |
| 5,406,498 | 4/1995 | Yabe | 364/491 |
| 5,410,491 | 4/1995 | Minami | 364/491 |
| 5,493,510 | 2/1996 | Shikata | 364/491 |
| 5,535,134 | 7/1996 | Cohn et al. | 364/491 |
| 5,619,419 | 4/1997 | D'Haeseleer et al. | 364/490 |
| 5,638,288 | 6/1997 | Deeley | 364/489 |
| 5,699,265 | 12/1997 | Scepanovic et al. | 364/491 |
| 5,808,899 | 9/1998 | Scepanovic et al. | 364/491 |
| 5,812,740 | 9/1998 | Scepanovic et al. | 395/10 |

OTHER PUBLICATIONS

Choi et al. ("A floorplanning algorithm using rectangular Voronoi diagram and force–directed block shaping", IEEE Comput. Soc. Press, 1991 IEEE International Conference on Computer–Aided Design, Nov. 11, 1991, pp. 56–59).

Dong et al. ("Constrained floorplan design for flexible blocks", IEEE Comput. Soc. Press, 1989 IEEE International Conference on Computer–Aided Design, Nov. 5, 1989, pp. 488–491).

Ohmura et al. ("Overlap resolution problem for block placement in VLSI layout", Electronics and Communiations in Japan, Part 3 (Fundamental Electronic Science), vol. 73, No. 6, pp. 68–77, Jun. 1, 1990).

Yamada et al. ("A block placement mehtod based on balloon model", IEEE International Symposium on Circuits and Systems, vol. 3, May 1, 1990, pp. 1680–1683).

Ying et al. ("An analytical approach to floorplanning for hierarchical building blocks layout (VLSI)", IEEE, IEEE Transactions on Computer–Aided Design of Integrated Circuits and Systems, vol. 8, No. 4, pp. 403–412, Apr. 1989).

*Primary Examiner*—Kevin J. Teska
*Assistant Examiner*—Phallaka Kik
*Attorney, Agent, or Firm*—Schmeiser, Olsen & Watts; H. Daniel Schnurmann

[57] ABSTRACT

Disclosed is a method and system for removing hardware overlap for use with a computer aided design apparatus. The method and system remove overlap by separately classifying all free blocks and blocks fixed in place, and then shifting cells between free blocks while maintaining the same relative ordering of the cells. Thus, all move bounds are respected and only cells that exist in free blocks actually move. The operation takes place one partition at a time, whereby a typical partition includes a row of cells.

24 Claims, 3 Drawing Sheets

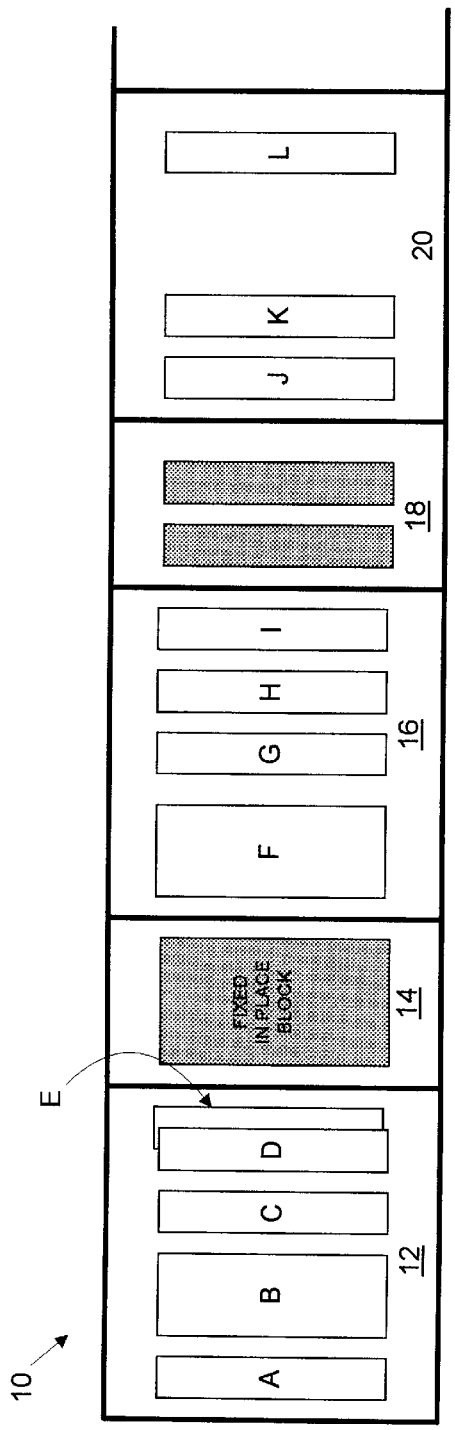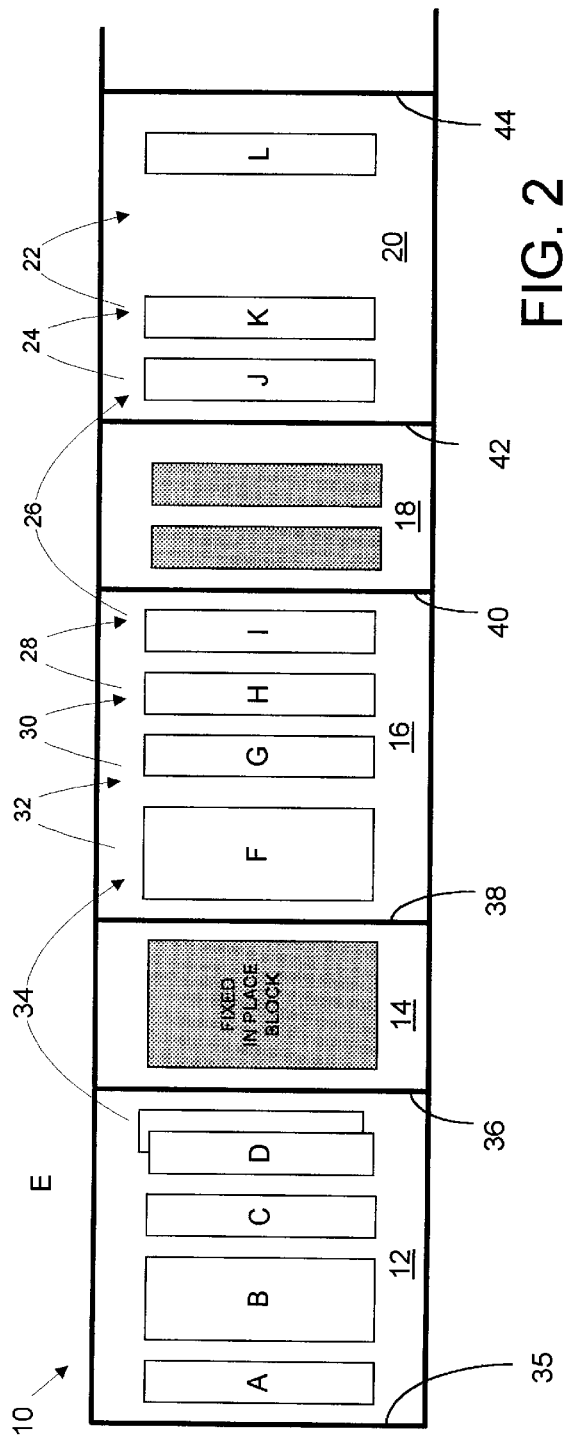

METHOD AND SYSTEM FOR REMOVING HARDWARE DESIGN OVERLAP

BACKGROUND OF THE INVENTION

1. Technical Field

The present invention relates to computerized engineering layout of integrated circuit devices. More particularly, this invention relates to a method and system of removing hardware overlap.

2. Background Art

One of the first steps in manufacturing integrated circuit chips involve the laying out or designing of the circuits to be packaged on a chip. This step, commonly referred to as "floor planning," is typically accomplished using computer aided design ("CAD") layout tools. CAD tools allow chip manufacturers to plan the layout of the circuits on a computer where they can be analyzed and stored. Once the process of floor planning is complete, the designs can be transferred onto a chip using a variety of known methods and systems.

When designing hardware, engineering layout is one of the most significant aspects of the overall process. The cells, circuits and other types of hierarchical entities must be placed upon a chip or other type of packaging in an optimimal position, while conforming to various constraints that include timing and performance characteristics. To achieve a high level of performance, the actual physical location, or target location, of circuits, and their relational placement, are of critical importance. However, due to the high number (e.g., millions) of components that are required to be placed, a common problem, known as "overlap" often occurs. Overlap occurs when the floor planning software places two or more cells or circuits at the same physical location. Because it is undesirable to have two cells or circuits residing in the same physical location, some method of correction prior to actual manufacturing is required.

Presently, there are numerous methods of laying out circuits. Most attempt to deal at some level with the overlap problem. A first common floor planning method is referred to as annealing which uses a stochastic optimization algorithm. It does not eliminate overlap, but considers it as a cost constraint to be minimized. In its later stages, the algorithm attempts to remove as much overlap as possible, but fails to completely remove overlap since overlap is considered only one of many costs that make up the overall efficiency score given to any particular design. A second method of performing layout is referred to as recursive slicing or global placement. This process involves recursively partitioning the layout area into smaller and smaller areas. The recursive process terminates when the size of a cluster area meets the target specification for "smallness." This process normally leaves overlaps behind, and does not strive to remove them, as was the case in annealing, which considered overlap as one of the cost functions. In the case of recursive slicing, overlap removal is required prior to being able to complete the design in a meaningful way. Other scenarios include post-placement logic optimization and small changes to the underlying logic (referred to as engineering changes, or EC's) which must be incorporated in placement. In each of these cases, it is useful to quickly remove overlap, while minimizing perturbations to the design. EC's are typically roughly placed, and then overlap removal is performed.

Typical floor planning algorithms provide a reasonable level of effectiveness with respect to overlap removal, but are slow, complicated and generally fail to remove all cases of overlap. In addition, such systems do not fully respect design targets and move bounds when dealing with circuits or cells that overlap. Design targets refer to the desired physical location of the cell in question, while move bounds refer to areas on the device that contain circuits that are identified as "fixed in place" and therefore immovable. In such cases where move bounds are not considered, overlap removal has the potential of doing more harm than good, as certain timing critical circuits could be moved far off track from where they should be placed. Other violations could also be caused by ignoring move bounds during overlap removal.

An additional problem with existing systems that perform overlap removal as part of the overall floor planning effort is the amount of computational time involved. Typical systems require time proportional to $N^2$ where N is the number of circuits on the device. Given the number of circuits a typical system must process, this creates a serious limitation. All of the above-mentioned art is hereby incorporated by reference.

SUMMARY OF THE INVENTION

Disclosed is a method and system of correcting hardware overlap left behind from an initial floor planning process. (While the disclosed method and system are targeted to a post-processing system, it is recognized that it could be integrated into any existing floor planning system.) The system and method include two phases. The phase first involves moving cells between adjacent blocks to eliminate overcapacity within individual blocks. The second phase involves moving cells within each block to eliminate overlap while minimizing perturbation.

To remove over-capacity, the chip is divided into partitions, such as rows. The partitions are then further separated into "free blocks" and "blocks fixed in place." Free blocks are those areas of space that do not contain circuitry that must absolutely be fixed in a specific location. Thus, free blocks are the space between objects that are fixed in place. Once the free blocks are identified, overlap within a particular partition is removed by shifting the cells between adjacent free blocks.

More particularly, if a row or partition contains overlapping cells, and includes free blocks, it may be processed as follows. First, all of the cells within the design are marked as "unplaced." That is, they are released from their currently assigned position. Cells that must be fixed in place are then "replaced" within the partition. That is, those cells that are required to exist in a particular physical location are reassigned to their designated locations. Next, for each row having blocks that include overlap, overlap is removed by first identifying other free blocks in the same row that have available space. Cells are then recursively shifted between adjacent free blocks until the overlap removal within each free block is possible. A critical aspect of this process is that the same relative ordering among all of the cells within each row is retained. Upon completion of the overlap removal algorithm, cells are reassigned within each free block.

Reassignment of cells(which involves the second phase of this invention) within each free block may be done with any of the techniques described herein, or any other known method of assigning cells. One method is to examine the demand and capacity of each free block. If demand exceeds a certain percentage (e.g., 90%) of the capacity, then the cells may be evenly placed within the cell since the chances of any perturbation is small. Alternatively, if demand is less than a certain percentage of the capacity, then some additional criteria may be used to place the cells within the free block to minimize perturbations. For example, a recursive divide and conquer approach may be used that includes dividing the block into two smaller child blocks and then, if necessary, moving cells from a first smaller child partition having over-capacity to its counterpart that has under-capacity.

In accordance with the above, it is an advantage of the present invention to minimize impact to relative circuit placement of the circuit layout being designed.

In accordance with the above, it is a further advantage of the present invention to provide an overlap removal method wherein circuits are placed as close to their original target location as possible such as in the current free block being processed, or an adjacent neighboring free block.

In accordance with the above, it is a further advantage of the present invention to provide an overlap removal tool to minimize the impact to the timing of the circuit layout being designed, by minimizing perturbations from target placement, which closely correlates to timing.

In accordance with the above, it is a further advantage of the present invention to adhere to move bounds, including, but not limited to disjoint, overlapping and nested move bounds.

In accordance with the above, it is a further advantage of the present invention to provide a system of overlap removal that requires time proportional to only N Log N where N is the number of cells.

In accordance with the above, it is a further advantage of the present invention to provide a post-processing algorithm for use with various floor planning systems, such as those that include annealing.

The foregoing and other objects, features and advantages of the invention will be apparent from the following more particular description of the preferred embodiments of the invention, as illustrated in the accompanying drawings below.

BRIEF DESCRIPTION OF THE DRAWINGS

The preferred exemplary embodiment of the present invention will hereinafter be described in conjunction with the appending drawings where like designations denote like elements, and:

FIG. 1 depicts a circuit row having a free block that includes overlap.

FIG. 2 depicts the circuit row of FIG. 1 with a plan for eliminating the overlap by shifting cells in accordance with a preferred method of the present invention.

BEST MODE FOR CARRYING OUT THE INVENTION

Figure 3:
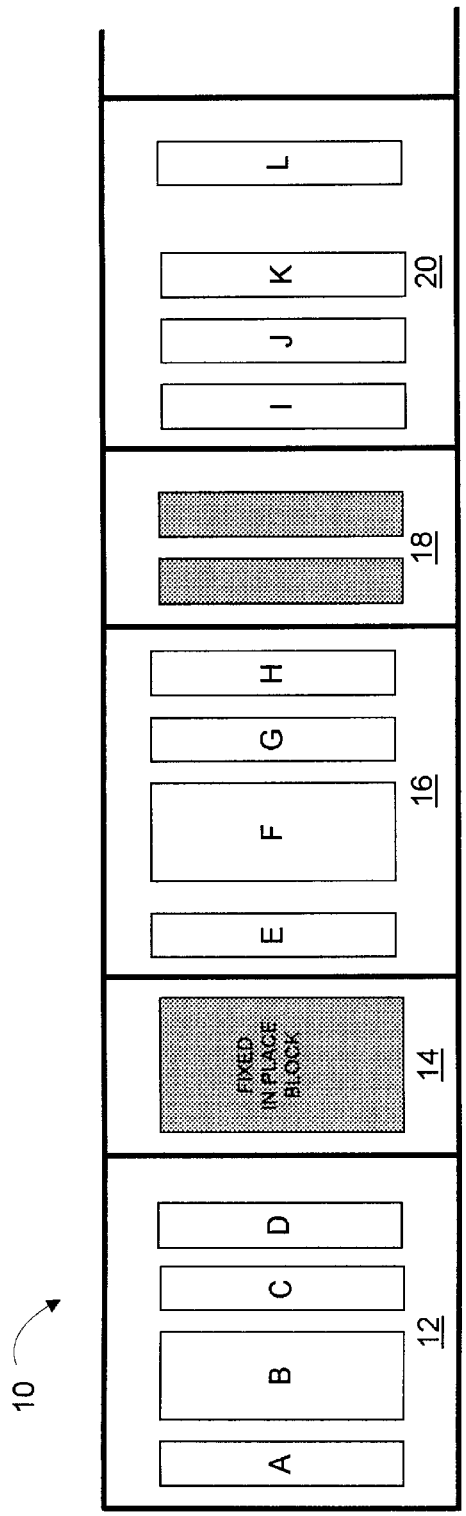
FIG. 3 depicts the circuit row of FIG. 1 after the overlap was removed in accordance with a preferred method of the present invention.

While the embodiments discussed herein are specifically directed to a method of removing overlap by processing circuit rows, it should be understood that the method is equally applicable to any partition type, including vertical and three-dimensional structures. FIGS. 1–4 depict a circuit row in various stages to which the present method is being applied. FIG. 1 depicts a portion of a circuit row 10 having both free blocks 12, 16 and 20 and blocks fixed in place 14 and 18. As noted above, a block or object that is fixed in place may include circuits, cells or other components that have been identified as needing to be located in a certain physical location. Examples include those circuits having move bounds, circuits serving an external function, or circuits marked as ignored for placement purposes. As shown in FIG. 1 each free block includes one or more cells (shown as A–L). The row of cells shown in FIG. 1 depicts a simplified example of what a layout might look like after a detailed floor planning has been run. As can be seen, free block 12 includes cells D and E that overlap each other, or reside in the same physical location.

For purposes of implementing this method in a computer system, the first step of correcting overlap would be to initialize the necessary placement data (i.e., setting up data structures, etc.). This may require counting the number of unfixed circuits for any row and perhaps calculating a factor for circuits that may be moved between rows. Next, the algorithm would "unplace" all of the cells in the row. This requires marking each cell as unassigned from its originally assigned position done during the initial floor planning routine. Next, cells identified as fixed in place (e.g., blocks 14 and 18) are then "replaced" back to their initially assigned location. Finally, the relative positioning of each free block in the row is determined (i.e., sorted) and a maximum number of free blocks in the circuit row is calculated.

In the next step, each row is processed to eliminate overlap. This may include setting up block boundaries 36, 38, 40, 42 and 44 (see FIG. 2), assigning each cell to the nearest free block without assigning a specific location within the free block and marking those free blocks that have overlap. Thus, initially, cells A–E would be assigned to block 12, cells F–I would be assigned to block 16, and cells J–L would be assigned to block 20. Referring to FIG. 2, free block 12 as noted above, includes an overlap. Thus, this particular row requires processing to remove the overlap. If the row did not include any overlap, each circuit would be reassigned back to its initial floor planning target location.

The method utilized to remove overlap includes the notion of assigning cells to blocks until it is possible to remove all overlaps within a free block while maintaining the same relative ordering amongst the cells within the row. One possible method of implementing such a routine would include a recursive shifting system or the like, wherein the closest free block having capacity to handle overlap is identified, and then cells are shifted from the free block having overlap to the free block having free space. In FIG. 2, this method is shown. As noted, free block 12 includes two overlapping cells that require correction. The algorithm searches for next closest free block, or groups of free blocks, having some available space. In this case, free block 20 is shown to have enough free space to handle the overlap occurring in free block 12. In order to accomplish the overlap removal, cell K is shifted 22 to the free area in free block 20, cell J is then shifted 24 to the position that cell K previously resided at, cell I is shifted from free block 16 to free block 20 and cells F, G and H are shifted within free block 16. Finally, cell E is shifted to free block 16 thereby relieving the overlap occurring in free block 12. Note that all of these shifts occurred around blocks 14 and 18, thereby respecting any existing move bounds that had been previously set up. The resulting row from this shift process is shown in FIG. 3 where it can be seen that no overlap exists in blocks 12, 16 or 20.

It should be recognized that the method of assigning cells to free blocks may use any type of algorithm so long as the relative ordering of the cells within the free blocks is maintained. As can be seen in FIG. 3, the cells A–L have maintained their relative ordering as initially placed by the floor plan shown in FIG. 1. In a typical algorithm for shifting cells between free blocks, a search will begin to find enough free space. The search may look at free blocks to the left, to the right, or alternating left and right. Additionally, as noted above, this same type of system could be applied to other types of partitions that either operates in a vertical fashion, or a three-dimensional fashion. Thus, it need not exclusively operate on rows. In summary, the processing of each row during overlap removal must (1) maintain the same relative ordering of cells amongst the free blocks, and (2) must respect all move bounds.

Figure 4:
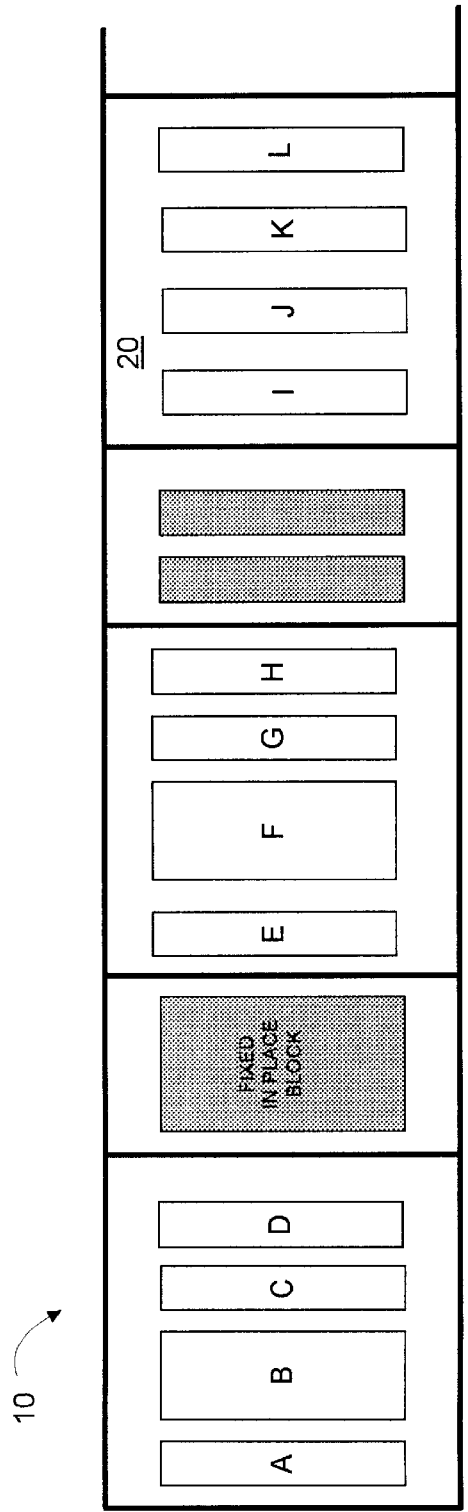
FIG. 4 depicts the circuit row of FIG. 1 after the overlap was removed and the shifted cells were reassigned to their new free blocks.

Finally, once the assignment of cells to free blocks is done, each cell is assigned to one or more leaves, or slots within a free block. A leaf is defined as the smallest discrete physical location for which a circuit or cell can be placed. FIG. 4 depicts one method of assigning cells within the free blocks. In particular, free block 20 shows the case where cells I, J, K and L have been placed into free block 20 in an equally spaced manner. Such a placement may or may not always be the most desirable method of placement. It has been recognized that for maximum performance it is best to base the placement of cells within each free block so as to cause a minimum of perturbation.

This embodiment suggests identifying different "placement" scenarios and handling each in a predetermined manner. A first scenario involves the case where demand (i.e., the total size of cells assigned to that block) exceeds a certain percent of capacity (i.e., the space within the block) but does not exceed the capacity of the free block. A second case is where demand is less than a certain percentage of the capacity. A final possibility includes the case where demand exceeds capacity (i.e., some overlap still exists).

In the case where demand exceeds a certain percentage of the capacity or is equal to the capacity, equal gaps may be placed between the cells within the free block. One method of doing this would be to first create a local move bound which is the intersection of the move bound and a space bound. (A space bound is the bound placed on a circuit by the space taken up between the circuit and the edge of the free blocked area, near its neighbors.) Then, for each circuit in the free bound, spread out the free space evenly between the circuits and "clip" to the local move bound limit and place the circuit therein. If problems still exist due to non-overlapping or nested move bounds, then allow all of the cells to fit in their move bounds by swapping the minimum number of cells.

In the case where demand is less than a certain percent of capacity, a recursive divide and conquer approach may be used. Because most placement programs in use today seldom permit over-capacity in a given block, and typically will seldom permit more than a 90% placement in a given block, the placing of cells within each free block is one of the more important aspects of this invention. The method and system of placing cells in accordance with this invention may be further summarized as follows. The free block is recursively divided into two smaller "child" blocks. When one of the child blocks is determined to have over-capacity, cells are moved from that block to its counterpart (which must have under-capacity) until the over-capacity is eliminated. Any moving of cells should be done in such a way so as to minimize the distance each cell is moved. The recursive subdivision continues until either (1) the available space in a block exactly matches the demand, or (2) there is only one cell left in the block. In the case where demand is exactly met, all cells are "brickwalled" into place (i.e., all cells are placed abutting each other with no space in between) in the order induced by their target location. In the case where only one cell is left, the lone cell is left in its place within the block (i.e., it is not moved within the block to the center, etc.). Finally, problems caused by non-overlapping or nested move bounds are checked. If any problems are found, the minimum number of cells are swapped to allow all of the cells to fit into their move bounds.

Finally, in the case where demand exceeds capacity the total amount of overlap may be evenly dispersed across each circuit.

Figure 5:
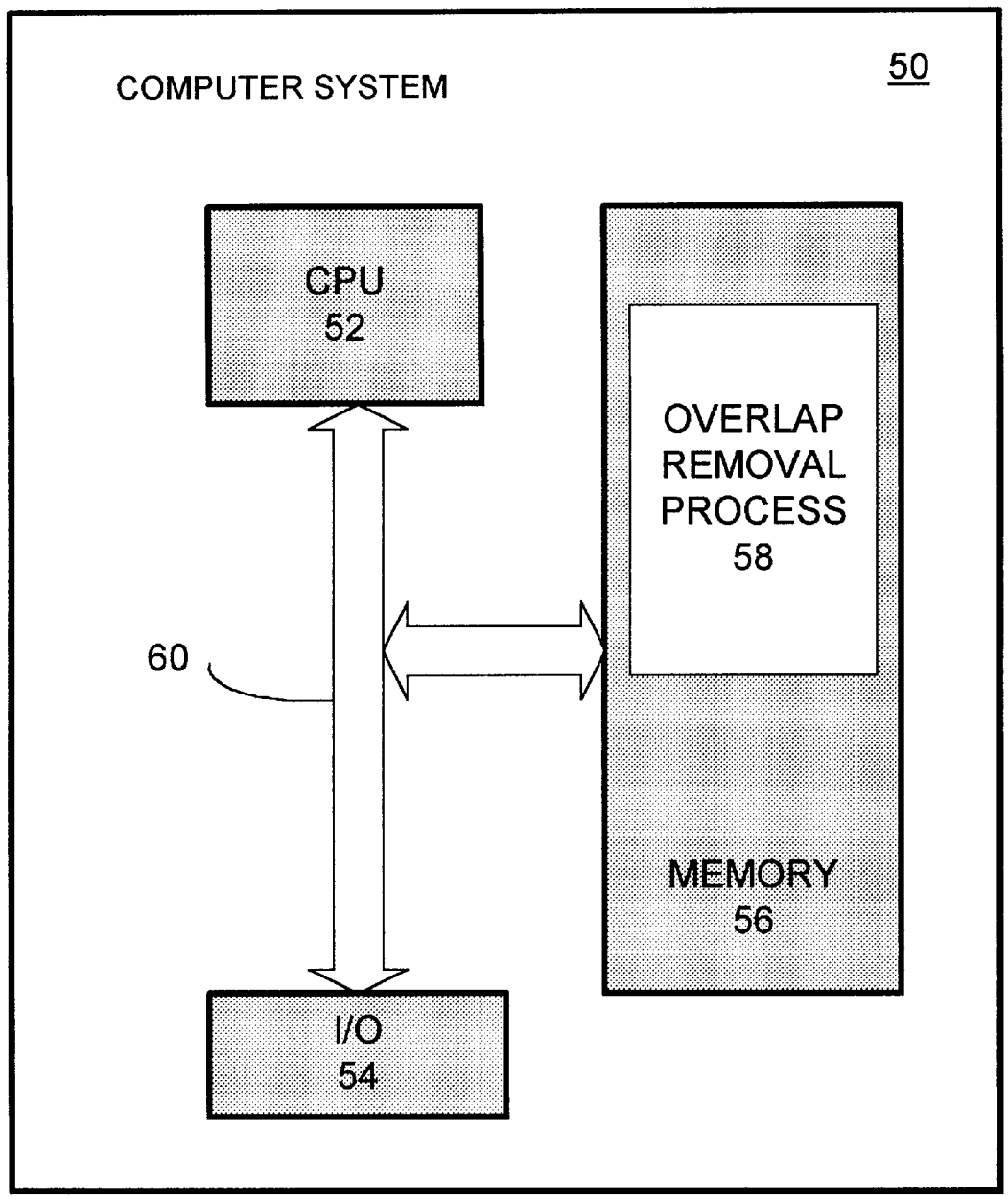
FIG. 5 depicts a computer system that includes means for removing overlap.

Referring now to FIG. 5, a computer system 50 is shown. The system includes a CPU 52, an input/output device (I/O) 54, a memory 56, and a bus 60 that connects the CPU 52, I/O 54 and memory 56. Additionally, the system contains an overlap removal process 58 stored in memory 56. Process 58 includes software for execution on CPU 52 that examines a floor plan, removes overlap, and either stores or outputs the results. The floor plan may exist in memory 56, may be imported via I/O 54, or may be accessed via any other known means. Likewise, the resulting floor plan (after overlap removal) may be stored in memory 56 or be output via I/O 54. The process 58 includes (1) means for identifying free blocks and fixed in place blocks in a floor plan; (2) means for identifying and sorting cells within the free blocks; (3) means for identifying overlap within the free blocks; (4) means for shifting cells between adjacent free blocks in order to reduce overlap while maintaining the same relative ordering among free block cells; and (5) means for reassigning cells to their new positions. The means for performing all of the above functions may be accomplished utilizing known software techniques and systems and may exist independently of each other or in a single integrated system. It should be recognized that the computer system shown in FIG. 5 is but one of many possible system configurations. Any method and system of operating on a set of data (i.e., a floor plan) may be substituted.

The foregoing descriptions of the preferred embodiments of the invention have been presented for purposes of illustration and description. It is not intended to be exhaustive or to limit the invention to the precise form disclosed, and obviously many modifications and variations are possible in light of the above teachings. Such modifications and variations that may be apparent to a person skilled in the art are intended to be included within the scope of this invention as defined by the accompanying claims.

We claim:

1. A method for removing hardware design overlap after an initial target location for each cell has been determined, said method comprising the steps of:

identifying all fixed blocks and free blocks in each of a plurality of circuit partitions, wherein free blocks are areas of space which are stationary, and wherein free blocks are available to hold cells that are moveable;

identifying all free blocks having overlap;

removing overlap for each partition having free blocks with overlap, by performing the steps of:

identifying free blocks with available space; and assigning cells to new free blocks to utilize said available free space while maintaining the same relative cell ordering within the partition and also minimizing the distance from said initial target location to said new free block.

2. The method of claim 1 wherein said step of assigning cells to free blocks includes the step of moving cells from a left side of a right free block to a right side of a left free block thereby maintaining the relative ordering of the cells.

3. The method of claim 1 wherein said step of assigning cells to free blocks includes the step of moving cells from a right side of a left free block to a left side of a right free block thereby maintaining the relative ordering of the cells.

4. The method of claim 1 wherein said step of assigning cells to free blocks includes the steps of:
choosing a first free block having overlap;
identifying a closest free block having available space to accommodate the overlap; and
beginning with said first free block and working toward the free block with the available space, shifting cells between intervening blocks until no overlap exists.

5. The method of claim 4 wherein the closest free block having available space to accommodate the overlap is a closest combination of free blocks having available space to accommodate the overlap.

6. The method of claim 1 wherein said partition is a horizontal row.

7. The method of claim 1 wherein said partition is a vertical row.

8. A method of removing residual cell overlap after cells have been assigned during a floor planning to an initial target location, said method including the steps of:
choosing a partition of cells within a floor plan;
identifying all free blocks and fixed blocks within said partition, wherein free blocks are areas of space which are stationary, and wherein free blocks are available to hold cells that are moveable;
reassigning cells amongst the free blocks in said partition to eliminate any over-capacity occurring in any of said free blocks while maintaining the same relative cell ordering within the partition; and
assigning cells within each free block in a manner that will eliminate any overlap occurring within each of said free blocks while minimizing perturbation from the initial target location.

9. The method of claim 8 wherein said step of reassigning cells amongst the free blocks includes the steps of:
unplacing all of the cells residing in free blocks;
defining a positional relationship of all of said cells residing in free blocks; and
processing the cells residing in free blocks using the steps of:
assigning each unplaced cell to a nearest free block;
identifying each free block having over-capacity; and
eliminating overlap by moving cells, as needed, between adjacent free blocks while maintaining the same relative ordering of cells within the partition.

10. The method of claim 8 wherein said step of assigning cells within each free block includes implementing a recursive division algorithm that recursively divides each free block into a pair of smaller blocks and then shifts cells, as needed, from a first smaller block having over-capacity to a second smaller block having under-capacity.

11. The method of claim 8 wherein said step of assigning cells utilizes a first assignment method if demand is less than a predetermined percentage of capacity, a second reassignment method if demand is greater than said predetermined percentage of capacity and a third reassignment method if demand exceeds capacity.

12. The method of claim 8 wherein said said partition is a row of cells.

13. A computer system for removing hardware overlap comprising:
a central processing unit;
a bus;
a computer system memory, said computer system memory being connected to said central processing unit via said bus;
a process wherein said process is executable by said central processing unit, said process including:
means for identifying each of a plurality of free blocks and fixed blocks in a device floor plan, wherein free blocks are areas of space which are stationary;
means for identifying each of a plurality of cells within said plurality of free blocks;
means for identifying overlap within said plurality of free blocks;
means for shifting cells between adjacent free blocks in order to eliminate over-capacity in each of said free blocks while maintaining the same relative ordering among free block cells; and
means for assigning cells within each of said free blocks.

14. The computer system of claim 13 wherein said plurality free blocks and fixed in place blocks are partitioned into rows.

15. The computer system of claim 14 wherein said means for shifting cells between adjacent free blocks operates row by row.

16. The method of claim 13 wherein said means for assigning cells within each of said free blocks includes recursively dividing the free block into two smaller blocks and, for the case wherein a first smaller block includes over-capacity and a second smaller block includes under-capacity moving cells from said first smaller block having over-capacity to said second smaller block that has under-capacity.

17. A method of providing an overlap-free placement of cells within a free block while minimizing perturbation wherein said free block includes adequate space for demand, wherein said free block is an area of space that is stationary, said method including the steps of:
recursively dividing the free block into two smaller blocks and for the case wherein a first smaller block includes over-capacity and a second smaller block includes under-capacity, moving cells from said first smaller block having over-capacity to said second smaller block that has under-capacity;
stopping the recursive dividing of the block upon reaching a predetermined condition; and
assigning cells to their new target locations.

18. The method of claim 17 wherein said cells that are moved out of said first smaller block having over-capacity and into said second smaller block having under-capacity are moved only a minimum distance necessary to eliminate over-capacity in said first smaller block.

19. The method of claim 17 wherein said moving of cells out of said first smaller block having over-capacity and into said second smaller block having under-capacity is done in a manner such that the same relative ordering of cells within the block is maintained.

20. The method of claim 17 wherein said step of stopping the recursive dividing occurs when the available space within the free block exactly matches the demand.

21. The method of claim 20 wherein said step of assigning cells is accomplished by brickwalling the cells in the order induced by the target placement.

22. The method of claim 17 wherein said step of stopping the recursive dividing occurs when only one cell is left in the free block.

23. The method of claim 22 wherein said step of assigning cells is accomplished by leaving the lone cell where it resides within its block.

24. A program product for processing a free block that includes adequate space for its demand, said system comprising:

a recordable media;

a computer program stored on said recordable media, said computer program including:

means for recursively dividing the free block into two smaller child blocks, wherein the free block is an area of space which is stationary;

means for moving at least one cell from a first smaller child block having over-capacity to a second smaller child block having under-capacity;

means for stopping said recursive dividing upon a predetermined condition; and means for assigning said cells to their new locations.

* * * * *